United States Patent [19] [11] 4,337,443
Umeda et al. [45] Jun. 29, 1982

[54] SEMICONDUCTOR LASER DEVICE WITH FACET PASSIVATION FILM

[75] Inventors: Jun-ichi Umeda, Hachioji; Toshikazu Shimada; Michiharu Nakamura, both of Hinodemachi; Yoshifumi Katayama, Tokorozawa; Takashi Kajimura; Shigeo Yamashita, both of Hachioji, all of Japan

[73] Assignee: Hitachi, Ltd., Tokyo, Japan

[21] Appl. No.: 124,266

[22] Filed: Feb. 25, 1980

[30] Foreign Application Priority Data

Feb. 26, 1979 [JP] Japan .................................. 54-20802

[51] Int. Cl.$^3$ ............................................. H01S 3/19
[52] U.S. Cl. ........................................ 372/49; 357/52
[58] Field of Search ..................... 331/94.5 H; 357/17, 357/18, 2, 52

[56] References Cited

U.S. PATENT DOCUMENTS 3,849,738 11/1974 Hakki ............................ 331/94.5 H
3,914,465 10/1975 Dyment ............................ 357/52 X
3,943,462 3/1976 Thompson ..................... 331/94.5 H
4,095,011 6/1978 Hawrylo et al. .......... 331/94.5 H X
4,178,564 12/1979 Ladany et al. ................ 331/94.5 H
4,254,426 3/1981 Pankove .................................. 357/2

OTHER PUBLICATIONS

Furuse et al., "Insulating Carbon Coating on (AlGa)As DH Laser Facets", Appl. Phys. Lett. 33(4), Aug. 15, 1978, pp. 317–318.

Primary Examiner—James W. Davie
Attorney, Agent, or Firm—Craig & Antonelli

[57] ABSTRACT

A semiconductor laser element is disclosed which includes a film of an amorphous material deposited on at least an optical output facet of the laser element and contains silicon and hydrogen as the indispensable components. The thickness of the amorphous film is preferably selected in the vicinity of $(\lambda/4)\cdot m$ where $\lambda$ represents wavelength of laser light in the amorphous film and m represents an odd integer. A film of a transparent insulation material can be deposited over the amorphous film thereby to constitute a composite film. With the disclosed structure of the semiconductor laser element, increasement in a threshold current of the laser element can be suppressed to a minimum, while a maximum optical output power can be increased.

9 Claims, 3 Drawing Figures

SEMICONDUCTOR LASER DEVICE WITH FACET PASSIVATION FILM

The present invention relates to a semiconductor laser element having a passivation film of a novel composition provided at an optical output facet.

Heretofore, it has been known to form a passivation film of a transparent insulation material such as $SiO_2$, $Al_2O_3$ or the like at the optical output facet of a semiconductor laser element. Such passivation film is provided for the purpose of protecting the corresponding crystal surface from oxidation by isolating the facet from ambient atmosphere. With the hitherto known materials or compositions for the passivation film, reflectivity at the facet becomes remarkably different in dependence on the thickness of the passivation layer, involving significant variation in a threshold current as an accompanying effect.

Further, with the conventional passivation film, it is impossible to provide a satisfactory protection against a facet erosion ascribable to catastrophic degradation and photo-chemical process and at the same time prevent the threshold current from being increased. With the present invention, it is intended to overcome the above problems to thereby allow a maximum optical output power of a semiconductor laser to be increased significantly while suppressing the increasing in the threshold current to a minimum.

The maximum optical output power of the semi-conductor laser element undergoes limitation due to a so-called damage of facet. Generally, two causes may be enumerated for such damage. One of them is a so-called catastrophic degradation which takes place instantaneously at the output power of about 5 to 10 mW for a lasing width of 1 μm possibly due to the fact that electric field strength of light at the corresponding crystal surface will exceed a certain limit. The other of the causes for the damage is what is referred to as photochemical reaction which proceeds progressively as a function of oxidation at the crystal surface and becomes significant at an optical output power higher than about 1 mW for the width of lasing of 1 μm.

Attempts have heretofore been made to prevent the oxidation described above by forming passivation film of $SiO_2$, $Al_2O_3$ or the like at the optical output facet of the semiconductor laser element thereby isolating the facet from the ambient atmosphere. In this case, when the film thickness is selected to be equal to $(\lambda/4) \times m$ where $\lambda$ is wavelength of light in the passivation film and m is an odd integer equal to 1, 3, 5, ..., the intensity of light at the crystal surface will be decreased whereby the catastrophic degradation must be improved. However, the passivation film of the material described above exhibits a low refractive index (e.g. refractive index of $SiO_2$ is about 1.45 and that of $Al_2O_3$ is about 1.75 in contrast to the refractive index of GaAs on the order of 3.6), which approximates to the condition of anti-reflection. As the result, the reflectivity of facet becomes extremely low, incurring a remarkably increasing in the threshold current. Under the circumstance, the thickness of the passivation film is in practice selected equal to $(\lambda/2) \times m'$ ($m' = 1, 2, 3 \ldots$). In this case, although the increased threshold current is not observed, the intensity of light at the facet is substantially equal to the one available in the absence of the passivation film. Thus, the passivation film serves merely as the reinforcing member at the crystal facet and an isolating film for isolating the facet from the atmosphere.

Some prior art semiconductor laser elements are reported, for example, in the following references:

(1) Applied Physics Letters, vol. 30 p. 87, 1977 (I. Ladany et al.);

(2) Applied Physics Letters, vol. 31 p. 625, 1977 (Y. Shima et al.); and (3) Japanese Journal of The Applied Physics, vol. 18 No. 3 p. 693, 1979 (T. Kajimura et al.)

The invention is to solve the problems of the hitherto known semiconductor laser elements described above.

In one aspect of the invention, at least an optical output facet of a semiconductor laser element is provided with a film of an amorphous material which contains silicon and hydrogen as indispensable elements.

According to the teaching of the invention, variation in the threshold current ascribable to the presence of the passivation film can be suppressed to a minimum.

Further, in the case of the semiconductor laser element according to the invention, it is possible to increase significantly the maximum optical output power while suppressing the increasing tendency in the threshold current to a minimum.

Typical examples of the amorphous materials which may be employed for carrying out the invention are as follows:

(1) Amorphous material having a composition of $Si_{1-x}H_x$ where $0.002 \leq x \leq 0.4$ When the content or ratio x of hydrogen is not higher than about 0.002, all the dangling bonds of silicon present in amorphous silicon (hereinafter referred to as a-Si in abridgement) can not be filled with hydrogen, as the result of which it is difficult to attain a transparent insulation film. On the other hand, when the content x of hydrogen is not lower than 0.4, the film quality becomes too fragile to serve as the passivation film. For practical application, it is preferred that the hydrogen content x be higher than 0.05, inclusive.

(2) Amorphous material having a composition of $(Si_{1-s-t}Ge_s \cdot C_t)_{1-x} \cdot H_x$.

It is preferred that $0 \leq s < 0.5$, $0 \leq t \leq 0.3$, and $0.002 \leq x \leq 0.4$. The material having a large proportion of s is suited for a long-wavelength laser having a high effective refractive index, while a material having a large proportion t is suited for a short-wavelength laser exhibiting a low effective refractive index.

An amorphous material having a proportion t of C not lower than 0.3 exhibits such a tendency that the optical absorption is increased while insulating property of the film is deteriorated as the part t increases. Thus, the range of composition described above is preferred.

According to another aspect of the invention, at least a transparent insulation film may be disposed on the passivation film containing hydrogen and silicon as indispensable elements, to thereby constitute a composite passivation film.

The above and other objects, aspects and advantages of the invention will become more apparent from the following description taken in conjunction with the accompanying drawings, in which.

Figure 1:
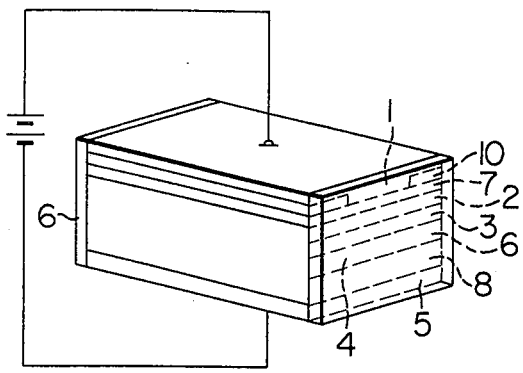
FIG. 1 is a perspective view showing a semiconductor laser element according to an embodiment of the invention.

The amorphous material which contains hydrogen and silicon as indispensable elements exhibits such properties as described below and are thus extremely preferable as passivation materials for semiconductor laser elements.

(1) Wide band gap on the order of 1.2 eV to 2.2 eV can be attained in dependence on the content of hydrogen and fabricating conditions. Consequently, the amorphous materials can be regarded to be transparent to laser light of conventional semiconductor lasers inclusive of GaAs—GaAlAs lasers (wavelength is in a range of 0.7 to 0.9 μm with a band gap in a range of 1.78 eV to 1.4 eV) and InP-InGaAsP lasers (wavelength is in a range of 1 to 1.7 μm with band gap in a range of 1.24 eV to 0.73 eV) and the like.

(2) The amorphous materials have high resistivities and can thus be regarded essentially as an insulator material (It is possible in reality to attain a higher resistivity than $10^7$ Ω.cm).

(3) A dense film exhibiting a high capability of preventing oxidation can be implemented.

(4) The amorphous materials have high refractive indexes which approximate to those of various semiconductor materials constituting the semiconductor laser elements. Accordingly, even when the film thickness is selected equal to $(\lambda/4) \times m$ where $\lambda$ is wavelength of laser light in the amorphous material and m is an odd number such as 1, 3, 5 . . . , there will occur substantially no decrease in the reflecting power or reflectivity at the facet of the laser element.

The fourth feature is extremely important. More specifically, the amorphous material containing hydrogen and silicon as indispensable elements and applied to cover the optical output facet of a semiconductor laser element in thickness of $(\lambda/4) \times m$ (m=an odd number) allows the semiconductor laser element to be implemented with an adequate protection against the damage of facet ascribable to both the catastrophic degradation and the photo-chemical process. Besides, the increasing in the threshold current can be substantially prevented, while the maximum optical output power can concurrently be increased.

Description will be made of internal variation in the reflecting power at a facet of a semiconductor laser element, which variation is brought about by provision of a passivation film.

The reflecting power (R) at the facet as observed interiorly of the semiconductor laser element is given by the following expression:

$$R = \frac{(n_a-n)^2(n+1)^2 + (n_a+n)^2(n-1)^2 + 2(n_a^2-n^2)(n^2-1)\cos 4\pi \frac{d}{\lambda}}{(n_a+n)^2(n+1)^2 + (n_a-n)^2(n-1)^2 + 2(n_a^2-n^2)(n^2-1)\cos 4\pi \frac{d}{\lambda}}$$

where
n: refractive index of the passivation film,
$n_a$: effective refractive index of an active layer of the semiconductor laser element,
λ: wavelength of laser light in the passivation film, and d: thickness of the passivation film. (It has been assumed that refractive index of air is equal to 1).

The refractive index of the amorphous materials according to the invention lies in a range of ca. 3.2 to ca. 3.7 in dependence on the wavelength of laser light and fabricating conditions. On the other hand, the refractive indexes $n_a$ of semiconductor materials used for semiconductor laser elements lie generally in a range of ca. 3.4 to ca. 3.8.

By way of example, a semiconductor laser of GaAlAs having a refractive index $n_a$ of 3.6 will be examined. When the thickness of the passivation film is selected equal to λ/4 with n equal to 3.42, then reflecting power or reflectivity R is equal to 0.28. In the case where no passivation film is present or the film thickness is selected equal to λ/2, then R is equal to 0.32. In this manner, the reflecting power or reflectivity at the facet will not deviate from the range of 0.28 to 0.32. Thus, variation in the reflecting power may essentially be neglected for practical applications. The same holds true for the variation in the threshold current.

Figure 3:
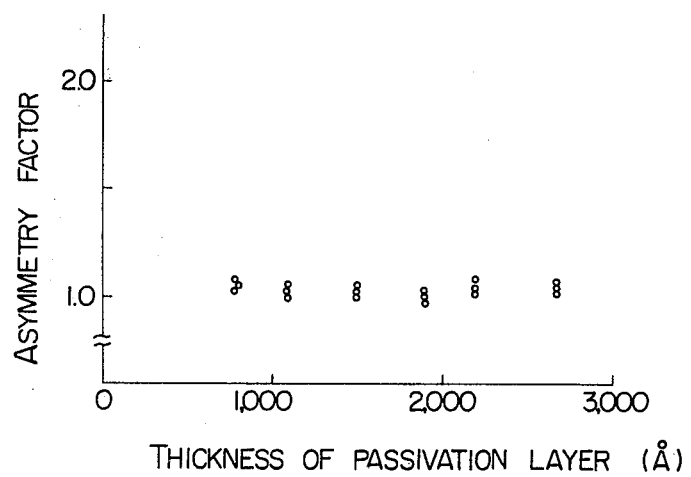
FIG. 3 is a diagram to show distribution of asymmetry factors which represent ratios of the optical outputs from both facets of a semiconductor laser element as a function of thickness of the passivation film.

FIG. 3 illustrates distribution of asymmetry factors each of which represents the compared result of optical outputs in opposite directions of a semiconductor laser element. More specifically, a film of hydrogenated amorphous silicon is deposited at one of the optical output facets of the laser and both the optical outputs in opposite directions are compared with each other. When the asymmetry factor is equal to 1, this means that both the optical outputs are equal to each other. The film thickness of the hydrogenated amorphous silicon film is taken along the abscissa. It will be seen that at any film thickness, unequality of the asymmetry factors are within a range tolerable for the practical purposes. Accordingly, it is safe to say that no substantial decrease in the reflecting power will occur at any thickness of the passivation film.

Next, the maximum optical output power will be discussed. It should be first mentioned that the maximum optical output power depends predominantly on the intensity of light at the output facet of the semi-conductor laser element.

In general, the electric field strength of light (I) at the interface between the optical output facet of the semiconductor laser element and the amorphous passivation film may be given by the following expression:

$$I = \frac{1}{n} \sqrt{1 + \frac{(n^2-1)}{2}\left(1 + \cos\frac{4\pi n}{\lambda_o} d\right)} \cdot I_o$$

where $I_o$: electric field strength of emitted laser light,
n: refractive index of the amorphous material,
o: wavelength of laser light vacuum,
: wavelength of laser light in the amorphous material, and
d: thickness of the amorphous film.

Accordingly, when $$d = \frac{1}{4} \cdot \frac{\lambda_o}{n} = \frac{\lambda}{4},$$

the electric field strength of light (I) is at a minimum value of 1/n.

In practice, by setting the thickness of the passivation film so that $$d = \frac{\lambda}{4}(1 \pm 0.3),$$

the advantageous effects contemplated by the invention can be attained satisfactorily.

The amorphous material to be used can be fabricated through a reactive sputtering method, decomposition of silane by glow discharge or the like process.

In carrying out the reactive sputtering method, a conventional sputtering apparatus can be used. The sputtering may be effected in the atmosphere of a rare gas (argon is employed in most cases) containing hydrogen with silicon used to form a target to be sputtered. Gas pressure may be selected in a range adequate for sustaining a glow discharge. In general, a gas pressure in a range of $10^{-4}$ to $10^{-2}$ Torr may be used. A gas pressure not higher than $10^{-3}$ Torr is preferred especially when a film exhibiting a high oxidation-resistive property is to be formed. Hydrogen content may be in a range of 1 to 40% and selected in accordance with practical designs. A sample (i.e. semiconductor laser element) to be deposited with the amorphous material is maintained at a temperature in a range of a room temperature to 400° C. for sputtering. When the sample is maintained at a room temperature in the atmosphere of argon containing 20% of hydrogen ($10^{-3}$ Torr), an amorphous silicon film containing about 17% of hydrogen can be obtained.

In the case of the composition of $(Si_{1-s-t}Ge_sC_t)_{1-x}H_x$, thin pieces of individual component elements are juxtaposed with areas of the thin pieces being correspondingly varied, and subsequently the sputtering is effected.

Further at least a transparent insulation film may be deposited on the passivation film of the amorphous material containing silicon and hydrogen as the indispensable component, thereby to make the transparent layer to serve as the protection film for the passivation film.

Typical examples of the transparent insulation material will encompass $SiO_2$, $Al_2O_3$, $MgO$, $ZnO$, $TiO_2$, $Si_3N_4$ and the like which have heretofore been known as the materials suited for passivation film. Especially preferable is the insulation material which is highly capable of resisting oxidation. The protection films may be realized through conventional sputtering methods.

By virtue of provision of the second passivation film as described above, it is possible to protect the inherent passivation film of the amorphous material from any modification such as oxidation throughout a very long period. In this case, the thickness $d_2$ of the second transparent insulation film should be so selected that $d_2 \approx \lambda_2/2$ where $\lambda_2$ represents the wavelength of laser light in the second transparent insulation film. Then, the passivation effect of the amorphous material will never be disturbed. For practical applications, it will be sufficient that $d_2 = \lambda_2/2 (1\pm 0.3)$.

Figure 2:
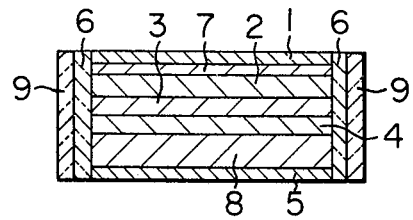
FIG. 2 is a sectional view showing a semiconductor laser element according to another embodiment of the invention.

FIG. 2 shows an exemplary structure of a semiconductor laser element provided with a passivation film 6 formed of an amorphous material and a second insulation film 9 deposited over the passivation film 6. The laser structure is shown in a sectional view taken along a line parallel to the direction in which the laser light is emitted. In FIGS. 1 and 2, same reference numerals are used to denote the same or like parts.

Assuming that the thickness of the amorphous film 6 is equal to $\lambda/4$ with the thickness of the second insulation film 9 being equal to $\lambda_2/2$, the reflecting power or reflectivity of the laser energy as observed internally of the semiconductor laser 3 is given by $$\frac{(n_a n_o - n^2)^2}{(n_a n_o + n^2)^2}$$

where $n_o$ represents the refractive index of air (i.e. equal to 1), $n_a$ represents the effective refractive index of the active region 3 of the semiconductor laser, and n represents the refractive index of the amorphous film 6.

It will be appreciated that the reflecting power remains same as in the case where the second insulation film 9 is absent. The intensities of light at the interface between the second insulation film 9 and the amorphous film 6 as well as at the interface between the second insulation film 9 and air remain same as the intensity of light at the interface between the passivation film and air in the case of the second insulation film 9 being absent. In other words, the effect of passivation of the amorphous film 6 will not be adversely influenced by the presence of the protection film 9.

In the following, the invention will be described in conjunction with examples.

EXAMPLE 1

A semiconductor laser element of a double hetero structure formed of GaAlAs crystal which per se is known is prepared. FIG. 1 is a perspective view showing an example of a semiconductor laser element having a double hetero structure. In the figure, numeral 1 denotes a positive electrode, 2 denotes a P-type crystal layer of $Ga_{1-x}Al_xAs$ (x=0.6) having a thickness of 2 μm and doped with Zn at a concentration of about $10^{17}$ cm$^{-3}$, 3 denotes an undoped crystal layer of $Ga_{1-y}Al_yAs$ (y=0.15) having a thickness of 0.1 μm and serving as an active layer, 4 denotes N-type crystal layer of $Ga_{1-z}Al_zAs$ (z=0.6) having a thickness of ca. 3 μm and doped with Te at a concentration of ca. $10^{18}$ cm$^{-3}$, 7 denotes a P-type layer of GaAs having a thickness of ca. 1 μm, 5 denotes a negative electrode, 8 denotes a substrate of GaAs, and 10 denotes an insulation layer.

In FIG. 1, reference numeral 6 designates a hydrogenated amorphous silicon layer or film according to the invention. This amorphous silicon layer was formed through sputtering of silicon. An apparatus of a conventional diode type was used for the sputtering. As the target, single crystal of silicon having a high purity (99.9999999%) was used. The prepared semiconductor laser element was mounted tightly on a water-cooled sample holder with the facet normal to the optical axis of the laser being orientated toward the target.

In order to prevent the amorphous silicon material from being deposited on the surface except for the facet extending perpendicularly to the optical axis of the laser, a pair of plates of stainless steel, single crystal plates of GaAs or the like each having a thickness substantially equal to the length of the laser in the axial direction thereof may be disposed on the water-cooled sample holder, so that the laser element can be clamped tightly between the paired plates in the thicknesswise direction in a sandwiched manner.

A vacuum chamber of the sputtering apparatus was filled with a mixture gas of argon (80%) and hydrogen (20%) at a total pressure of 1 Pa ($\approx$0.007 Torr). The inter-electrode space was selected at 40 mm. The sputtering was effected with an input r.f. power of 250 W having a frequency of ca. 13.65 MHz. After a time elapse of about 150 seconds from the initiation of sputtering, a hydrogenated amorphous silicon layer could be formed in a thickness of 560 Å at the facet of the semiconductor laser element.

The semiconductor laser element thus fabricated is capable of lasing at a wavelength of ca. 7700 Å with a current not lower than 106 mA. The wavelength of laser light is 2251 Å in the amorphous silicon film. Accordingly, the thickness of 560 Å corresponds just to a quarter of the wavelength.

Laser light emitted from the active layer 3 will interfere with light reflected from the interface between the amorphous film 6 and air, to thereby form a node of a standing wave at the interface between the active layer 3 and the film 6 to reduce significantly the intensity of light. In this case, assuming that the refractive index of the film is represented by n, the electric field strength of light at this interface amounts to $1/n$ as compared with the case where no film is provided or film thickness is equal to $\lambda/2$. Since $n \approx 3.4$ in the case of the amorphous silicon, the electric field strength of light is equal to $1/3.4$. Accordingly, the intensity of light is equal to $(1/3.4)^2$. Of cource, the intensity of emitted light remains invariable. In this way, the damage due to photochemical reaction progressing at this interface in proportion to the intensity of light is reduced significantly. On the other hand, limitation of the maximum optical output power due to the catastrophic degradation determined by the electric field strength of light is significantly increased.

Advantageous features of the semiconductor laser element according to the invention described above may be summed up as follows:

However, similar or equivalent effects can be attained with a multi-layer structure, an example of which will be described below.

According to the same procedures as those adopted in the preceding Example, a hydrogenated amorphous silicon film having a hydrogen content x of 0.17 and a thickness of 560 Å was deposited on the facet of the prepared semiconductor laser element. Subsequently, a film of $Al_2O_3$ of 2200 Å in thickness is deposited on the hydrogenated amorphous film through a sputtering method. For deposition of the film of $Al_2O_3$, the target electrode constituted by single crystal silicon in the preceding Example was replaced by an electrode plate of $Al_2O_3$ while argon gas containing no hydrogen was used as the atmosphere gas.

Since the thickness of the film of $Al_2O_3$ corresponds just to $\lambda/2$ in terms of the wavelength of laser light, the reflecting power or reflectivity observed internally of the laser element as well as electric field strength of light at the interface between the laser element and the hydrogenated amorphous silicon film are utterly same as in the case where no $Al_2O_3$-film is present. Thus, various characteristics of the laser element as attained are same as those summed up in the table recited hereinbefore. The laser of a two-layer structure implemented according to the present Example can enjoy a high stability over a long period because surface oxidation of the hydrogenated amorphous silicon film is protected from oxidation due to the presence of the $Al_2O_3$-film.

In the case of the lasing wavelength of 7700 Å, proper thickness of various transparent insulation films are as follows:
$SiO_2$: ca. 2660 Å
MgO: ca. 2200 Å
$TiO_2$: ca. 1540 Å

|  | Invention | Prior Art | |
|---|---|---|---|
| Types of films | amorphous silicon (containing 17% of H) | $Al_2O_3$ | |
| Film thickness | $\lambda/4$ (560 Å) | $\lambda/4$ (1100 Å) | $\lambda/2$ (2200 Å) |
| Refrectivity at facet | 0.28 | 0.0065 | 0.32 |
| Threshold current | 106 mA | no lasing (presumed 267 mA) | 100 mA |
| Maximum optical output power (Breakdown limit of facet) | 270 mW | no lasing | 80 mW |
| Intensity of light at facet (proportional to degradation rate due to photo-chemical reaction) At optical output power of 30 mW | 2.6 mW | no lasing | 30 mW |

The thickness of the amorphous silicon film which permits the maximum optical output power of the inventive laser to be twice as high as that of the hitherto known laser element is given by $\lambda/4$ $(1\pm 0.28)$, i.e. in the range of 720 Å to 406 Å, while the thickness which allows the output power to be three times as high as or much higher than that of the hitherto known laser is given by $\lambda/4$ $(1\pm 0.10)$, i.e. in the range of 620 Å to 506 Å.

With the hydrogen content x of 0.01, 0.03, 0.05, 0.2 and so forth in the amorphous silicon film, similar results could be obtained.

EXAMPLE 2

In the case of Example 1, it has been assumed that only the hydrogenated amorphous film is employed.

In the foregoing, description has been made on the GaAlAs semiconductor laser element having a lasing wavelength of about 7700 Å. However, it goes without saying that similar effects can be obtained for the laser elements having different lasing wavelengths by adjusting or matching the film thickness to the lasing wavelengths.

EXAMPLE 3

In the case of the semiconductor laser element employing materials other than GaAlAs-series, the refractive indexes of the semiconductor crystals are substantially in the range of 3.4 to 3.6 which coincides with the range of refractive indexes of hydrogenated amosphous silicon. Thus, equivalent effects to those described above can be obtained. Examples of the invention applied to InGaAsP, InGaP and PbSnTe semiconductor lasers are listed in the following table.

| Material | $In_{0.73}Ga_{0.27}As_{0.63}P_{0.37}$ | $In_{0.48}Ga_{0.52}P$ | PbSnTe |
|---|---|---|---|
| Refractive index | 3.6 | 3.4 | 3.8 |
| Lasing wavelength | 1.3 μm | 0.7 μm | 6 μm |
| Thickness of hydrogenated amorphous silicon film (n = 3.42, λ/4) | 950 Å | 512 Å | 4390 Å |
| Improving factor of threshold current ascribable to the amorphous film | 1.06 (times) | 1.0 (invariable) | 1.15 |
| Improving factor of maximum optical output power | 3.4 (times) | 3.4 | 3.4 |
| Reduction factor of facet degrading rate | 11 (times) | 11 | 11 |

As will be appreciated from the foregoing description, use of the hydrogenated amorphous film as a protection film at the optical output facet of the semiconductor laser elements permits increasement in the threshold current to be suppressed significantly. Besides, by selecting the film thickness equal to λ/4 or m·λ/4 where m represents an odd integer, surprising improvements can be attained in respect of the maximum optical output power as well as the degrading tendency of the facet. The invention can be advantageously applied to semiconductor lasers in general such as four-element lasers inclusive of GaAlAs lasers, InGaAsP lasers and GaAlAsP lasers, three-element lasers inclusive of InGap lasers and GaAsP lasers, PbSnTe lasers, and the like.

EXAMPLE 4

A semiconductor laser element of a double hetero structure having an active layer constituted by $In_x Ga_{1-x}As_y P_{1-y}$-crystal (x=0.73 and y=0.63) which per se has been hitherto known is prepared. The structure of this laser element is substantially same as the one shown in FIG. 1. The laser element will lase at a wavelength of about 1.3 μm. For the passivation film 6 shown in FIG. 1, a hydrogenated amorphous film of silicon-germanium is used. In this case, a polycrystalline alloy of Si-Ge containing 10 at. % of Ge was used as the sputtering target. Of course, a fine array of Si- and Ge-crystals arrayed on the target in an area ratio of 9:1, for example, may be employed in place of the alloy described just above. The sputtering conditions correspond to those described hereinbefore in conjunction with Example 1. A hydrogenated amorphous film of Si- Ge could be formed on the facet of the semiconductor laser element in thickness of 900 Å. In this example, the contents of Si and Ge in the amorphous film are in the ratio of 7 to 3 while the content x of hydrogen is 0.1. The thickness of 900 Å corresponds just to a quarter of the wavelength of laser light in the amorphous film. The refractive index of 3.6 exhibited by the amorphous film is higher than that of the film containing no germanium and approximates to the effective refractive index of the laser element. Thus, variation in the reflecting power at the facet in dependence on the film thickness can be reduced to an advantage.

In this way, the hydrogenated amorphous film of silicon and germanium is very effective as the passivation film especially for a laser element exhibiting a high effective refractive index at a relatively long wavelength.

EXAMPLE 5

A semiconductor laser element having a double hetero structure having an active layer constituted by a crystal of $Ga_{1-x}Al_xAs$ (x=0.3) is prepared. The structure is substantially same as the one shown in FIG. 1. The laser element will lase at ca. 7200 Å. The passivation film 6 shown in FIG. 1 was formed of a hydrogenated amorphous film of silicon-carbon. In this case, the sputtering target was constituted by Si-crystal wafers and graphite wafers having widths of 16 mm and 4 mm, respectively, in a strip-like configuration and arrayed alternately close to one another. The area ratio of Si and graphite in the target plane is 4:1. Through the same sputtering procedures as mentioned in Example 1, the ratio of Si to C contained in the film on the order of 10 to 1 could be attained. Through this process, a hydrogenated amorphous film of silicon-carbon could be formed at the facet of the semiconductor laser element in thickness of 600 Å. The content of hydrogen x was 0.1. This thickness of 600 Å corresponds to a quarter of the wavelength of laser light in the amorphous film. The refractive index of the amorphous film is lower than that of the hydrogenated amorphous silicon film containing no carbon. The improving factor of the maximum optical output power is substantially equivalent to that attained in the laser element described in Example 1. The amorphous composition added with carbon can advantageously reduce the rate of degradation of the characteristics which proceeds progressively over a long period. This aspect can be improved by a factor of about 1.3 or more as compared with the case in which no carbon is added.

What we claim is:

1. In a semiconductor laser element, the improvement comprising a film of an amorphous material deposited on at least an optical output facet of said laser element, said amorphous material containing silicon and hydrogen as indispensable components.

2. A semiconductor laser element according to claim 1, wherein a part of silicon contained in said amorphous material is substituted by at least one selected from the group consisting of germanium and carbon.

3. A semiconductor laser element according to claim 1, wherein said amorphous material has a composition of $Si_{1-x}H_x$ where $0.002 \leq x \leq 0.4$.

4. A semiconductor laser element according to claim 2, wherein said amorphous material has a composition of $(Si_{1-s-t}Ge_sC_t)_{1-x}H_x$ where $0.002 \leq x \leq 0.4$, $0 \leq s < 0.5$ and $0 \leq t < 0.3$.

5. A semiconductor laser element according to claim 1, 2, 3 or 4, wherein said film of said amorphous material has a thickness in the vicinity of $(\lambda)/(4) \cdot m$ where λ represents wavelength of laser light in said amorphous material and m represents an odd integer.

6. A semiconductor laser element according to claim 1, 2, 3 or 4, further including a film of a transparent insulation material deposited on said film of the amorphous material which in turn is deposited on at least an optical output facet of said laser element and contains silicon and hydrogen as indispensable components.

7. A semiconductor laser element according to claim 6, wherein said film of the transparent insulation material has a thickness in the vicinity of $\lambda_2/2\ m'$ where $\lambda_2$ represents wavelength of laser light in said film of transparent insulation material and m' represents an interger.

8. A semiconductor laser element according to claim 5, wherein a film of a transparent insulation material is deposited on said film of the amorphous material which in turn is deposited on at least the optical output facet of said laser element and contains silicon and hydrogen as indispensable components.

9. A semiconductor laser element according to claim 6, wherein said film of said amorphous material has a thickness in the vicinity of $\lambda/4 \cdot m_1$ and said film of said transparent insulation material has a thickness in the vicinity of $\lambda_2/2 \cdot m_2$, where $\lambda$ represents wavelength of laser light in said amorphous material, $m_1$ represents an odd integer, $\lambda_2$ represents wavelength of laser light in said film of the transparent insulation material and $m_2$ represents an integer.

* * * * *